(12) United States Patent
Pedersen et al.

(10) Patent No.: US 11,368,794 B2
(45) Date of Patent: Jun. 21, 2022

(54) MEMS MICROPHONE WITH INTEGRATED RESISTOR HEATER

(71) Applicant: Knowles Electronics, LLC, Itasca, IL (US)

(72) Inventors: Michael Pedersen, Long Grove, IL (US); Joshua Watson, Wheaton, IL (US); John Szczech, Bloomingdale, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 17/131,497

(22) Filed: Dec. 22, 2020

(65) Prior Publication Data

US 2021/0204071 A1 Jul. 1, 2021

Related U.S. Application Data

(60) Provisional application No. 62/955,370, filed on Dec. 30, 2019.

(51) Int. Cl.
| | |
|---|---|
| *H04R 19/00* | (2006.01) |
| *H04R 19/04* | (2006.01) |
| *B81B 7/00* | (2006.01) |
| *H04R 29/00* | (2006.01) |
| *H04R 1/04* | (2006.01) |
| *H04R 3/00* | (2006.01) |

(52) U.S. Cl.
CPC ........... *H04R 19/04* (2013.01); *B81B 7/0087* (2013.01); *H04R 1/04* (2013.01); *H04R 3/00* (2013.01); *H04R 29/004* (2013.01); *B81B 2201/0257* (2013.01); *B81B 2203/0127* (2013.01); *B81B 2203/04* (2013.01); *H04R 2201/003* (2013.01)

(58) Field of Classification Search
CPC . H04R 19/04; H04R 1/04; H04R 3/00; H04R 29/004; H04R 2201/003; H04R 1/08; B81B 7/0087; B81B 2201/0257; B81B 2203/0127; B81B 2203/04; B81B 7/02
See application file for complete search history.

(56) References Cited

U.S. PATENT DOCUMENTS 10,244,331 B1 * 3/2019 Deas .................. H04R 3/06

* cited by examiner

*Primary Examiner* — Matthew A Eason
(74) *Attorney, Agent, or Firm* — Loppnow & Chapa; Matthew C. Loppnow

(57) ABSTRACT

A microelectromechanical system (MEMS) transducer for integration in a microphone assembly is designed to produce heat-generated acoustic signals. The MEMS transducer generally comprises a substrate having an aperture, a transduction element located at least partially over the aperture and coupled to the substrate, electrical contacts coupled to the transduction element, and a resistor integrated with the substrate or the transduction element. The resistor is coupled to electrical contacts that are electrically isolated from the contacts of the MEMS transducer or transduction element. The transduction element includes an insulating material coupled to the substrate. The transduction element comprises a fixed electrode and a movable electrode located at least partially over the aperture of the substrate. The fixed electrode or the moving electrode is formed on the insulating material. The resistor can be formed on the insulating material or suspended from the insulating material.

28 Claims, 10 Drawing Sheets

MEMS MICROPHONE WITH INTEGRATED RESISTOR HEATER

CROSS-REFERENCE TO RELATED APPLICATIONS

The present application claims the priority benefit of U.S. Provisional Patent Application No. 62/955,370, filed Dec. 30, 2019, which is incorporated herein by reference.

FIELD OF THE DISCLOSURE

The present disclosure relates to microelectromechanical systems (MEMS) sensors, and in particular, to MEMS sensors having a resistor disposed on the same substrate.

BACKGROUND

Microphone assemblies that include microelectromechanical systems (MEMS) acoustic transducers convert acoustic energy into an electrical signal. The microphone assemblies may be employed in mobile communication devices, laptop computers, and appliances, among other devices and machinery. An important parameter for a microphone assembly is the acoustic signal-to-noise ratio (SNR), which compares the desired signal level (e.g., the signal amplitude due to acoustic disturbances captured by the microphone assembly) to the level of background noise. The signal-to-noise ratio may be used to determine functional status of the microphone assembly.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

DETAILED DESCRIPTION

Figure 1:
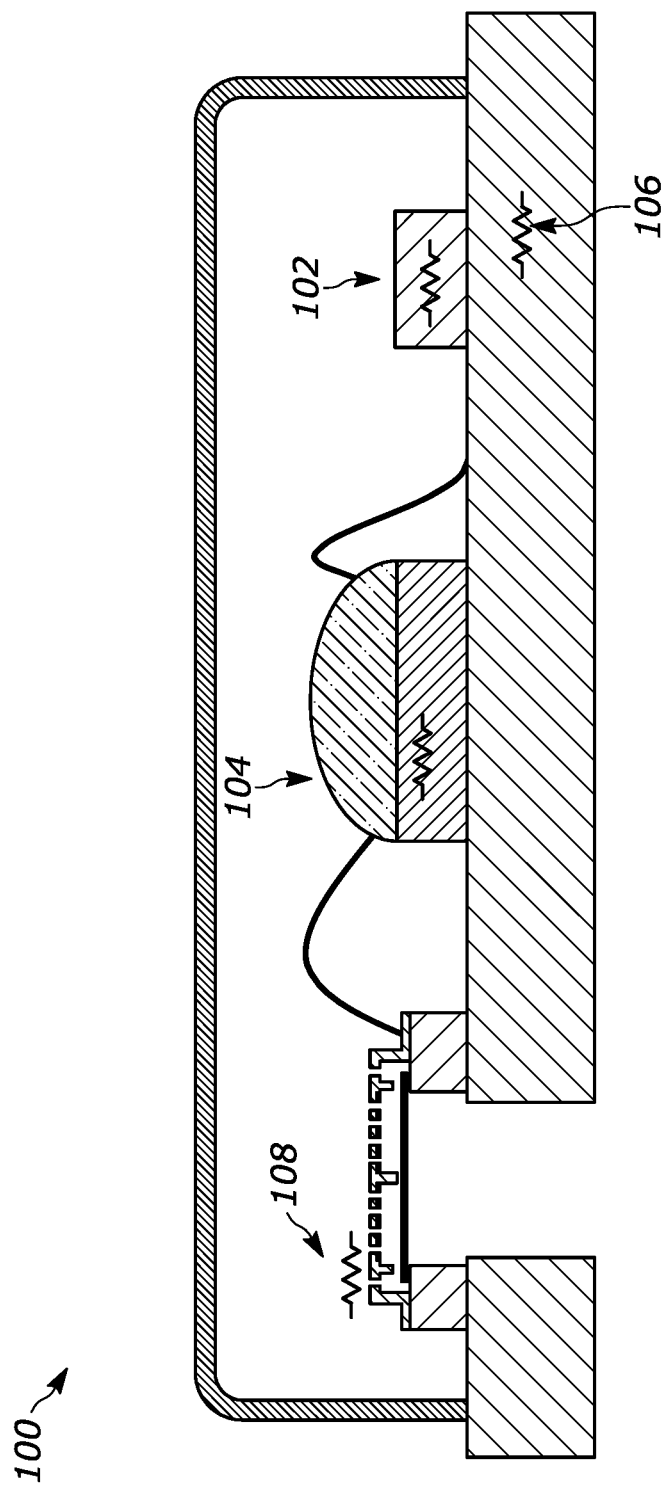
FIG. 1 is a schematic diagram of potential resistor locations in a microphone assembly according to an illustrative embodiment.

The drawings referred to in the descriptions below schematically illustrate the embodiments. The scales, the distances, the positional relations, and the like of members may be exaggerated, and illustration of part of the members may be omitted, for clarity. In the descriptions below, the same name or reference numeral generally represents the same member or a member made of the same material, and its repeated detailed description will be omitted as appropriate.

In general, disclosed herein is a microelectromechanical system (MEMS) transducer for integration in a microphone assembly that is designed to produce heat-generated acoustic signals. The MEMS transducer generally comprises a substrate having an aperture, an electro-acoustic transduction element located at least partially over the aperture and coupled to the substrate, electrical contacts coupled to the transduction element, and a resistor integrated with the substrate or the transduction element. The resistor is coupled to electrical contacts that are electrically isolated from the contacts of the MEMS transducer or transduction element. The transduction element includes an insulating material coupled to the substrate. The transduction element is a variable capacitor comprising a fixed electrode and a movable electrode located at least partially over the aperture of the substrate. The fixed electrode or the moving electrode is formed on the insulating material. The resistor can be formed on the insulating material or suspended from the insulating material.

According to some embodiments described herein, a microphone assembly that is designed to produce heat-generated acoustic signals includes a MEMS acoustic transducer, an integrated circuit, a substrate, a can, and an insulated resistor. The microphone device generally comprises a MEMS transducer and an integrated circuit disposed in an internal volume of a housing having a sound port and an electrical interface suitable for integration with a host device (e.g., using surface mounting technology). In one implementation, the housing comprises a can disposed on a substrate or base, the combination of which forms an internal volume in which the transducer and integrated circuit are disposed. The MEMS transducer may be a capacitive, piezoelectric or other transduction device configured to convert acoustic energy into an electrical signal. The MEMS transducer is coupled to the integrated circuit and the integrated circuit is coupled to contacts on the electrical interface. The integrated circuit capable of receiving and conditioning the electrical signal produced by the transducer. Such signal conditioning may include buffering, filtering, amplification, A/D conversion, protocol interface conversion, among other signal conditioning or processing. The integrated circuit may be an application-specific integrated circuit (ASIC). In some embodiments, the MEMS transducer is coupled to and positioned proximate a sound port formed in the substrate. In other embodiments, the transducer is coupled to and located proximate a sound port disposed in the can or cover portion of the housing.

Heating of a back volume between a substrate and a cover of a microphone device can generate acoustic waves, resulting in ambient noise. Various embodiments disclosed herein can increase the functionality and applications of MEMS microphones and transducers by taking advantage of design aspects previously thought to be flaws. In the majority of microphone devices, acoustic or ambient noise generated by the device negatively impacts the quality of the sound being recorded, particularly due to the proximity of the signal to the microphone itself. Internally-generated acoustic noise is considered generally undesirable as it is difficult to control, and compounds with any external ambient noise affecting the signal. However, if the generation of the acoustic noise was controllable by an integrated circuit, the noise can be generated in a purposeful manner. Among other benefits, a controllable acoustic signal within a MEMS microphone device may allow the device to be used in self-test applications and noise cancellation. The details of a device designed to perform such functions will be more fully explained by reference to FIGS. 1-7.

In FIG. 1, a microphone assembly 100 comprises a substrate and a can forming an enclosed volume in which an integrated circuit and a MEMS transducer are disposed. In order to produce device-level acoustic stimulation, a heat source must be placed in the enclosed volume of the microphone device. The heat source must be small, have high power consumption efficiency, and be limited in cost and complexity. In the present embodiments, a resistor is used as the heat source, but it will be appreciated that another heat source with similar functionality would suffice. Electrical resistance is a fundamental heat generator that is controllable through the size of the resistor and amount of current provided to the resistor. In order to achieve the highest efficiency and control over the heat source, the resistor is preferably air-insulated and must be thermally coupled to the air in the enclosed volume. Four potential locations for the resistor are identified in the enclosed volume of the microphone assembly: on the substrate (102), on the integrated circuit (104), within the base substrate (106), and on the MEMS die (108).

Location 102, on the substrate, requires free substrate space for the footprint of the resistor to be mounted within the enclosed volume, limiting the ability to further scale down in size. Location 102 also increases fabrication costs as a third element must be added to the substrate prior to addition of the can or cover. Location 104, on the integrated circuit, results in poor thermal coupling to the enclosed volume because the resistor would be encapsulated in interlayer dielectric layers. Location 104 would also increase the size of the integrated circuit. Location 106, within the base substrate, also results in poor thermal coupling to the enclosed volume due to the base substrate being sealed (e.g., with FR-4 and solder mask) during manufacturing. Location 108, on the MEMS die, does not take up as much space as location 102 and has good thermal coupling unlike locations 104 and 106 as a result of the MEMS die being exposed to the air in the enclosed back volume. Location 108 allows for the resistor to be electrically isolated from the transducer by virtue of the fabrication process providing for electrically isolated conductive structures; the fabrication process further provides flexibility in design of both the resistor and transducer.

Figure 2:
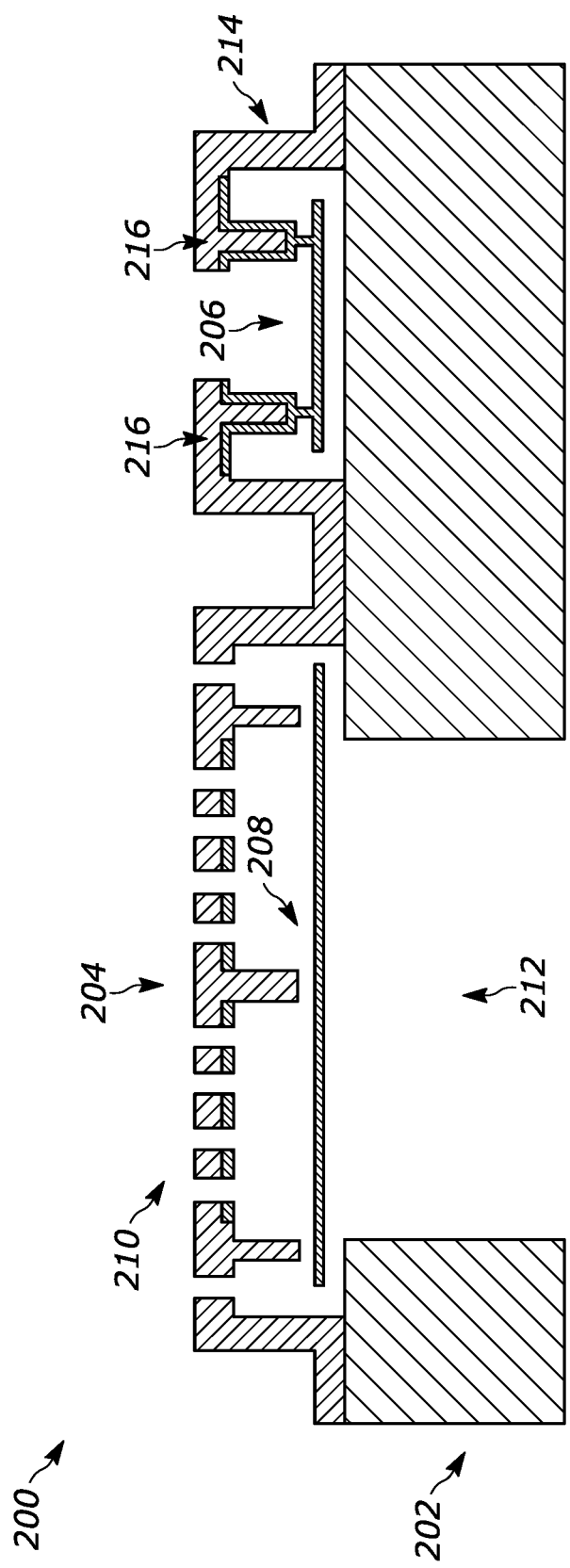
FIG. 2 is a schematic diagram of an exemplary MEMS transducer with a free plate diaphragm and air-insulated suspended resistor according to a first illustrative embodiment.

FIG. 2 is a schematic diagram of a MEMS die 200 with an electro-acoustic transduction element and a resistor according to a first embodiment. The MEMS die 200 includes a substrate 202, an electro-acoustic transduction element (transducer) 204, and a resistor 206. In FIG. 2, the transducer 204 has a diaphragm 208 and a back plate 210 wherein the diaphragm is oriented parallel to the back plate and is configured to move with respect to the back plate in response to variations in pressure received through a sound port 212. The transducer 204 is mounted at least partially over the sound port 212. Alternatively, the transducer 204 could be other than a capacitive device and it could be mounted on a lid or cover (not shown) instead of the base as described herein. The transducer 204 can generate an electrical signal detectable by an integrated circuit (not shown) in response to the movement of the diaphragm. The transducer 204 can include electrical contacts coupled to the integrated circuit and the integrated circuit can be programmed to receive and process the electrical signal generated by the transducer 204. The integrated circuit may be an application-specific integrated circuit (ASIC) or other type of programmable system on a chip.

The resistor 206 may be an air-insulated resistor fabricated similarly to the diaphragm 208 so as to maintain existing fabrication sequences. In the illustrated embodiment, an insulating material 214 is coupled to the substrate 202. The resistor 206 may be formed using the same material as the diaphragm, and may be suspended from the insulating material with tabs 216. The resistor is integrated with the substrate 202 or the transducer 204, and is electrically isolated from the transducer 204. The resistor 206 is coupled to electrical contacts that interface with the integrated circuit.

The integrated circuit can be programmed to use a thermo-acoustic relationship to drive a current through the resistor 206 to heat the enclosed volume to produce a known acoustic signal detectable by the transducer 204. The known acoustic signal is then incident on the diaphragm 208 and generates an electrical signal representative of the acoustic signal. The integrated circuit can be programmed to analyze the electrical signal to determine a status of the transducer such as a blocked, inoperable, or operable status from the frequency response of the detected signal. The integrated circuit may be further programmed to detect ambient noise from an incoming acoustic signal and drive a current through the resistor to produce a heat-induced acoustic signal to cancel the ambient noise.

Figure 3:
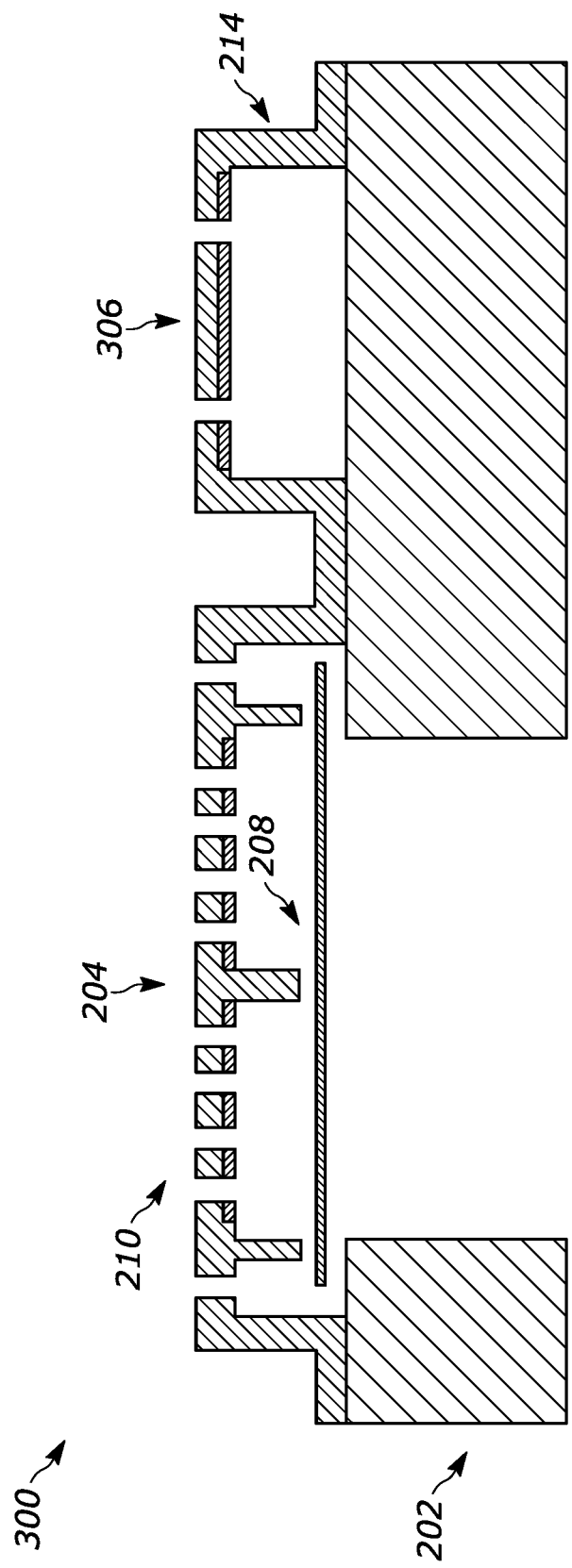
FIG. 3 is a schematic diagram of an exemplary MEMS transducer with a free plate diaphragm and air-insulated suspended resistor according to a second illustrative embodiment.

FIG. 3 is a schematic diagram of a MEMS die 300 with an electro-acoustic transduction element and a resistor according to a second embodiment. The MEMS die 300 includes a substrate 202, an electro-acoustic transduction element (transducer) 204, and a resistor 306. The resistor 306 is an air-insulated resistor fabricated similarly to the back plate 210 so as to maintain existing fabrication sequences. In the present embodiment, an insulating material 214 is coupled to the substrate 202. The resistor 306 is made from the same material as the back plate and is formed on the insulating material 214. The resistor may be integrated with the substrate 202 or the transducer 204, and is electrically isolated from the transducer 204. The integrated circuit can be programmed to drive a current through the resistor 306 and generate a known acoustic signal, and use the signal to assess a status of the transducer 204 and/or detect and/or cancel ambient noise in an incoming signal, in a manner similar to that described with respect to FIG. 2.

Figure 4A:
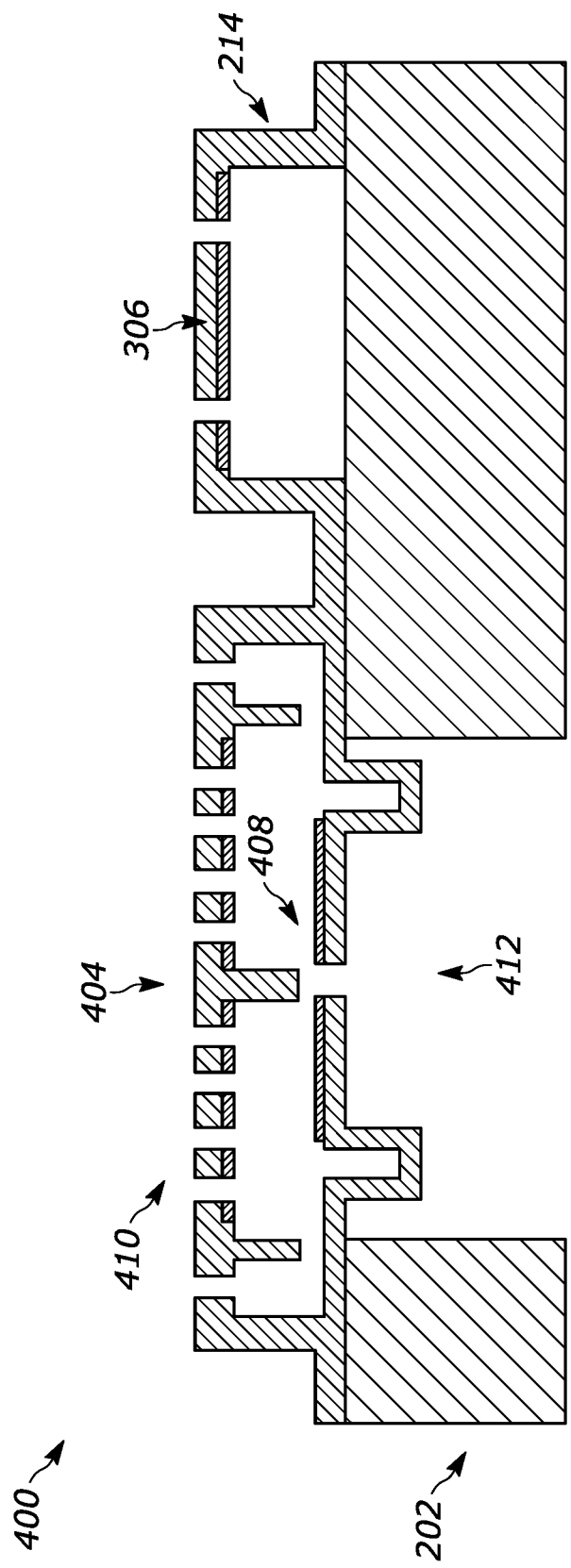
FIGS. 4A-B are schematic diagrams of an exemplary MEMS transducer with a constrained diaphragm and air-insulated suspended resistor according to a third illustrative embodiment.
Figure 4B:
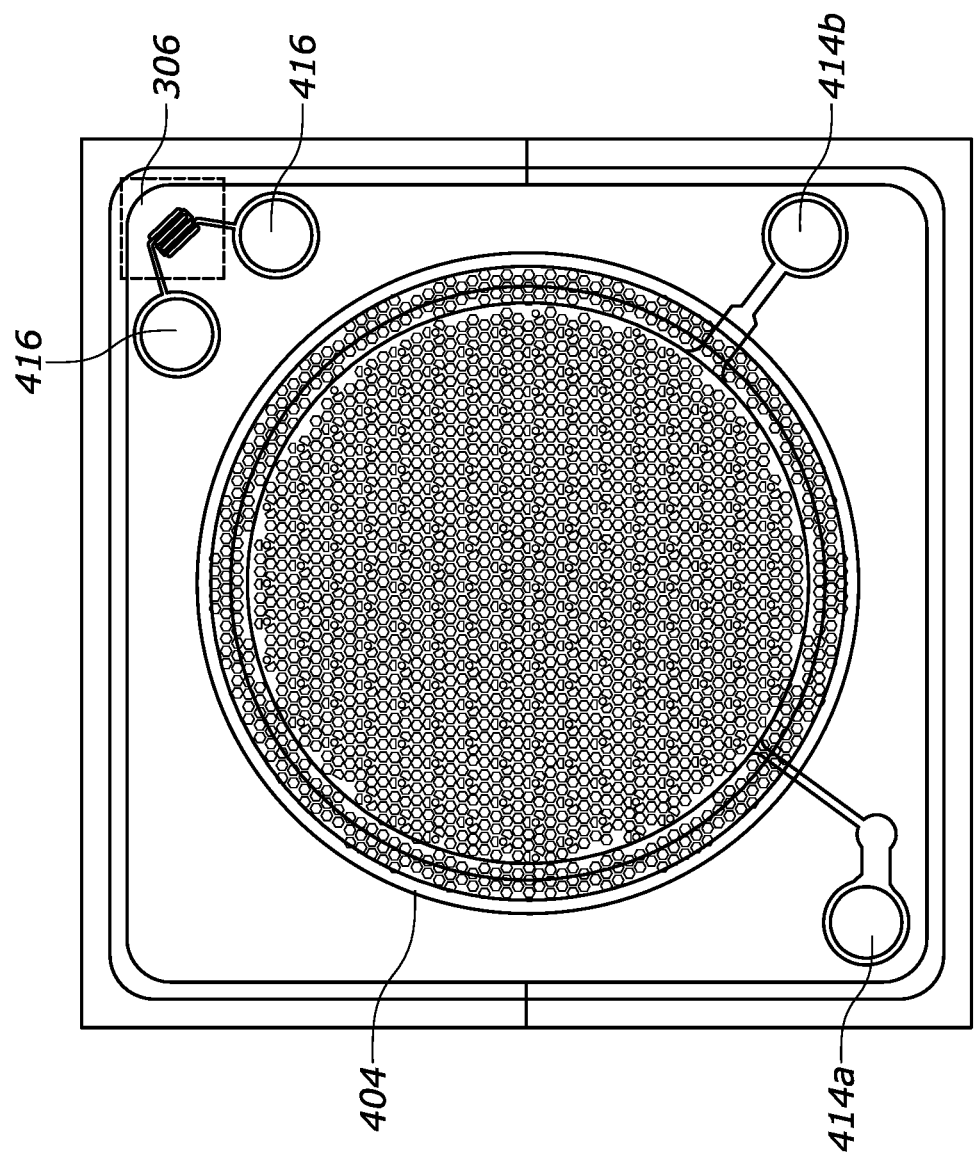

FIGS. 4A-B are schematic diagrams of a MEMS die 400 with an electro-acoustic transduction element and a resistor according to a third embodiment. The MEMS die 400 includes a substrate 202, an electro-acoustic transduction element (transducer) 404, and a resistor 306. In FIG. 4A, the transducer 404 has a moveable electrode (diaphragm) 408 and a fixed electrode (back plate) 410 wherein the diaphragm is oriented parallel to the back plate. An electrical signal representative of the acoustic stimulus may be generated and transmitted to an integrated circuit for processing through electrical contacts 414a and 414b, as seen in FIG. 4B. The transducer 404 is mounted at least partially over the sound port 412. Alternatively, the transducer 404 could be mounted on a lid or cover (not shown) instead of the base as described herein. The transducer 404 can generate an electrical signal detectable by an integrated circuit (not shown) in response to the movement of the diaphragm. In some embodiments the back plate 410 in transducer 404 may be absent, and diaphragm 408 is constructed using piezoelectric materials. An electrical signal is generated due to mechanical strain in the piezoelectric layers, resulting from deflection due to the incident acoustic pressure. The integrated circuit can be coupled to the transducer 404 through electrical contacts 414a-b and be programmed to receive and process the electrical signal generated by the transducer 404. The integrated circuit may be an application-specific integrated circuit (ASIC) or other type of programmable system on a chip. The integrated circuit can be programmed to drive a current through the resistor 306 through electrical contacts 416 and generate a known acoustic signal, and use the signal to assess a status of the transducer 404 and/or detect and/or cancel ambient noise in an incoming signal, in a manner similar to that described with respect to FIG. 2.

Figure 5:
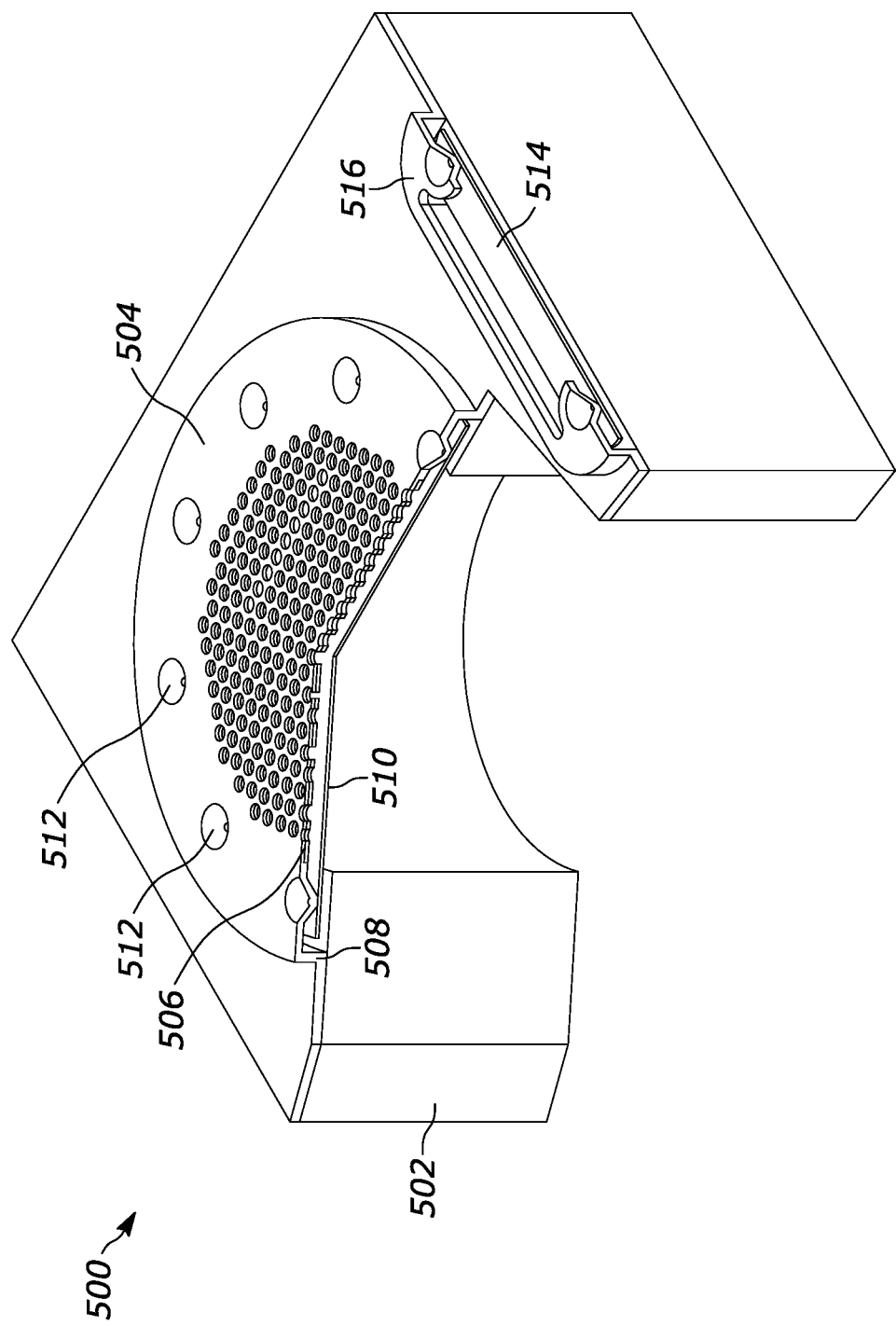
FIG. 5 is a three-dimensional diagram of an exemplary MEMS transducer according to the embodiment of FIG. 2.

FIG. 5 is a three-dimensional rendering of a MEMS transducer 500 with an integrated resistor according to the embodiment of FIG. 2. The MEMS transducer 500 includes a substrate 502, a microphone 504 mounted on the substrate, and an air-suspended resistor 514. The microphone 504 includes a back plate electrode layer 506, a back plate structural layer 508, and a diaphragm 510 oriented parallel to each other. The diaphragm 510 is free to move with respect to the back plate electrode layer 506 in response to pressure variations, and is positioned within a set of peripheral posts 512 protruding from the back plate structural layer 508 disposed about the circumference of the diaphragm 510. The substrate 502 may be coupled to an insulating layer 516. The resistor 514 is formed such that it is suspended from the insulating layer 516 and is formed of the same material as the diaphragm.

Figure 6:
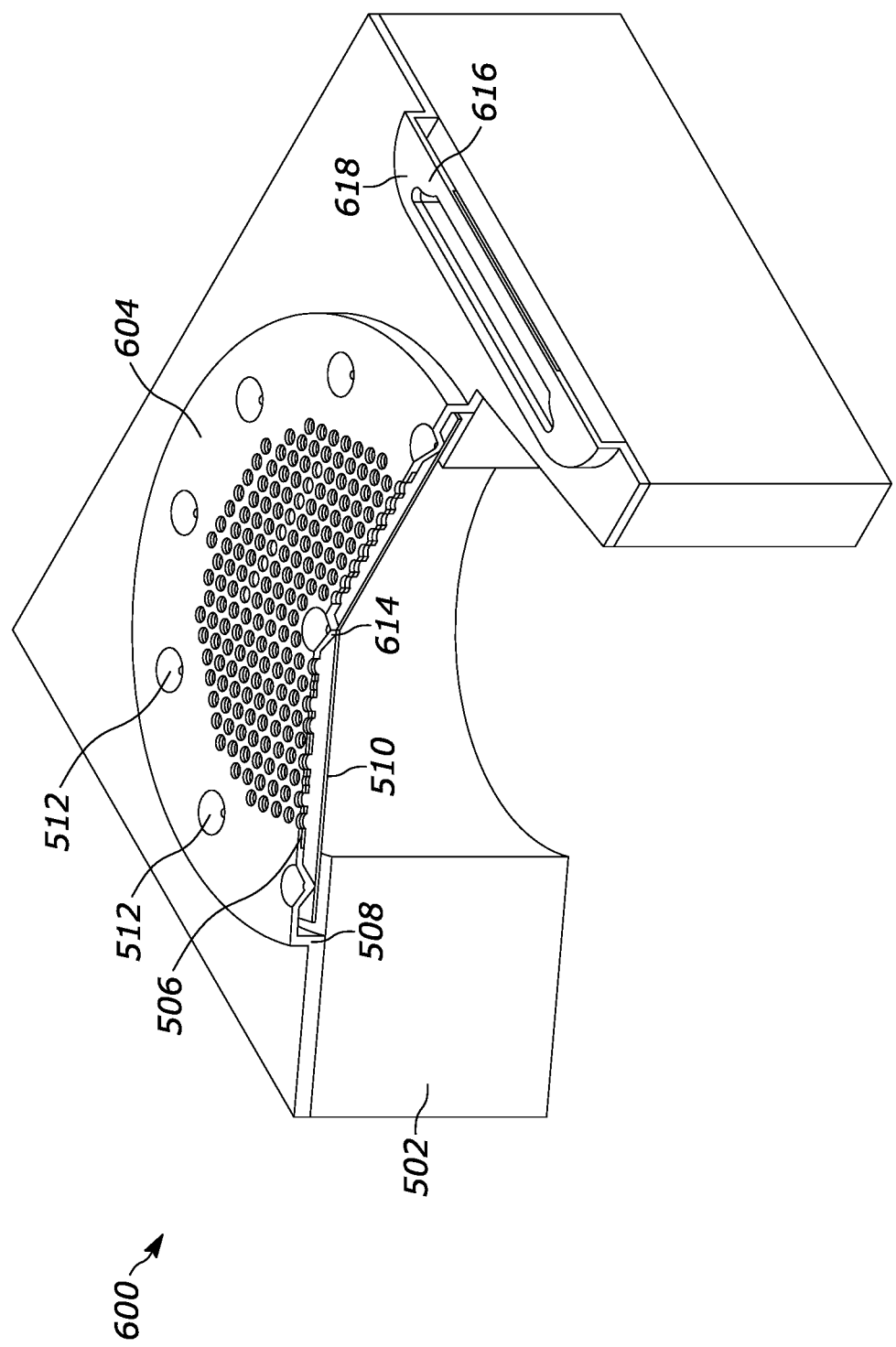
FIG. 6 is a three-dimensional diagram of an exemplary MEMS transducer according to the embodiment of FIG. 3.

FIG. 6 is a three-dimensional rendering of a MEMS transducer 600 with an integrated resistor according to the embodiment of FIG. 3. The MEMS transducer 600 includes a substrate 502, a microphone 604 mounted on the substrate, and an air-suspended resistor 616. The microphone 604 includes a back plate electrode layer 506, a back plate structural layer 508, and a diaphragm 510 oriented parallel to each other. The diaphragm 510 is configured to move with respect to the back plate electrode layer 506 in response to pressure variations. The diaphragm 510 is suspended from a center post 614 and is positioned within a set of peripheral posts 512 protruding from the back plate structural layer 508 disposed about the circumference of the diaphragm 510. The substrate 502 may be coupled to an insulating layer 618. The resistor 616 is formed within the insulating layer 618 and is of the same material as the back plate electrode layer 506.

It will be appreciated that the various embodiments described herein are not limited to the as-illustrated embodiments of FIGS. 2-6. For example, the MEMS die can include any combination of resistor or transducer described with respect to FIGS. 2-6. Furthermore, the transducer and resistor can be formed of same materials or different materials depending on the fabrication process used and requirements of the design.

Figure 7:
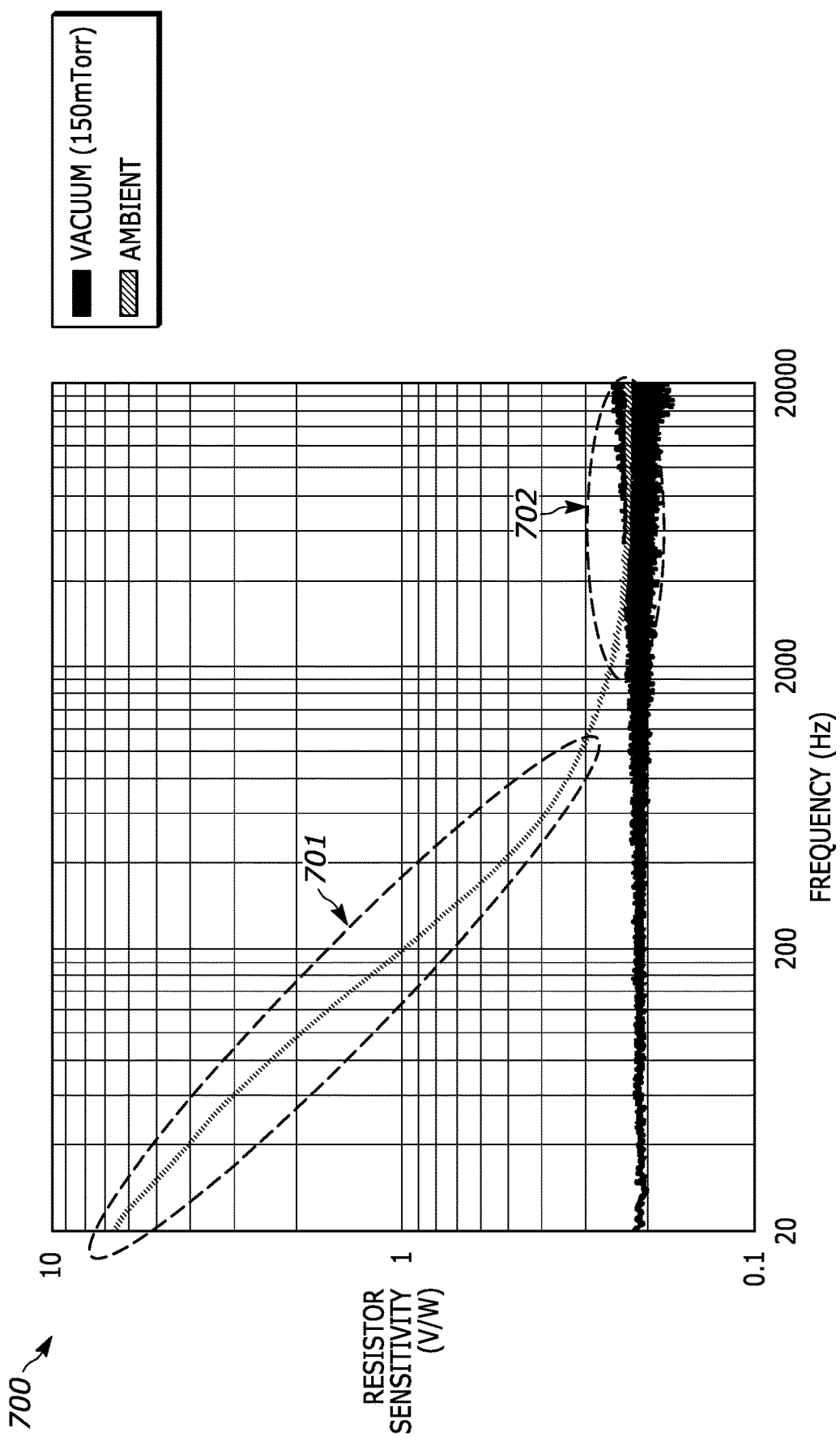
FIG. 7 is a graph of resistor sensitivity versus frequency illustrating the full range of the audio frequency band illustrating the full range of the audio frequency band.

FIG. 7 is a graph 700 of resistor sensitivity versus frequency illustrating the full range of the audio frequency band. The graph depicts the full range of the audio frequency band detectable by humans from 20 Hz to 20 kHz, and is split into two regions: region 701 spans from 20 Hz to 2 kHz, and region 702 spans from 2 kHz to 20 kHz. Acoustic coupling of the resistor and the air dominates the frequency band spanned by region 701 and electrical coupling of the resistor and the integrated circuit dominates the frequency band spanned by region 702. Region 701 covers the range of frequencies (2 Hz to 2 kHz) at which a sufficiently sensitive resistor can produce an acoustic signal, all of which are detectable by the human ear. When a person speaks into a microphone, such as during telephonic communication, the acoustic signal generated is in a usable voice frequency range of approximately 300 Hz to 3400 Hz, and telephones further rely on harmonics of a low fundamental frequency in this range to produce aliased signals where the full range can be heard. Therefore, any ambient noise detected at the microphone would be transmitted as part of the acoustic signal. However, any signal from 20 Hz to 2 kHz (and any aliases thereof) can be counteracted by a thermally generated acoustic signal from the resistor, thereby effectively cancelling the ambient noise to produce a smoother acoustic signal. The integrated circuit may be programmed to identify a frequency of ambient noise detected at the transduction element and drive current to the resistor to produce a noise at a frequency at which the aliased harmonic signals effectively cancel each other. The embodiment's current range allows for noise cancellation of the majority of sounds that would come into a microphone easily discerned by the human ear.

Figures 8A, 8B:
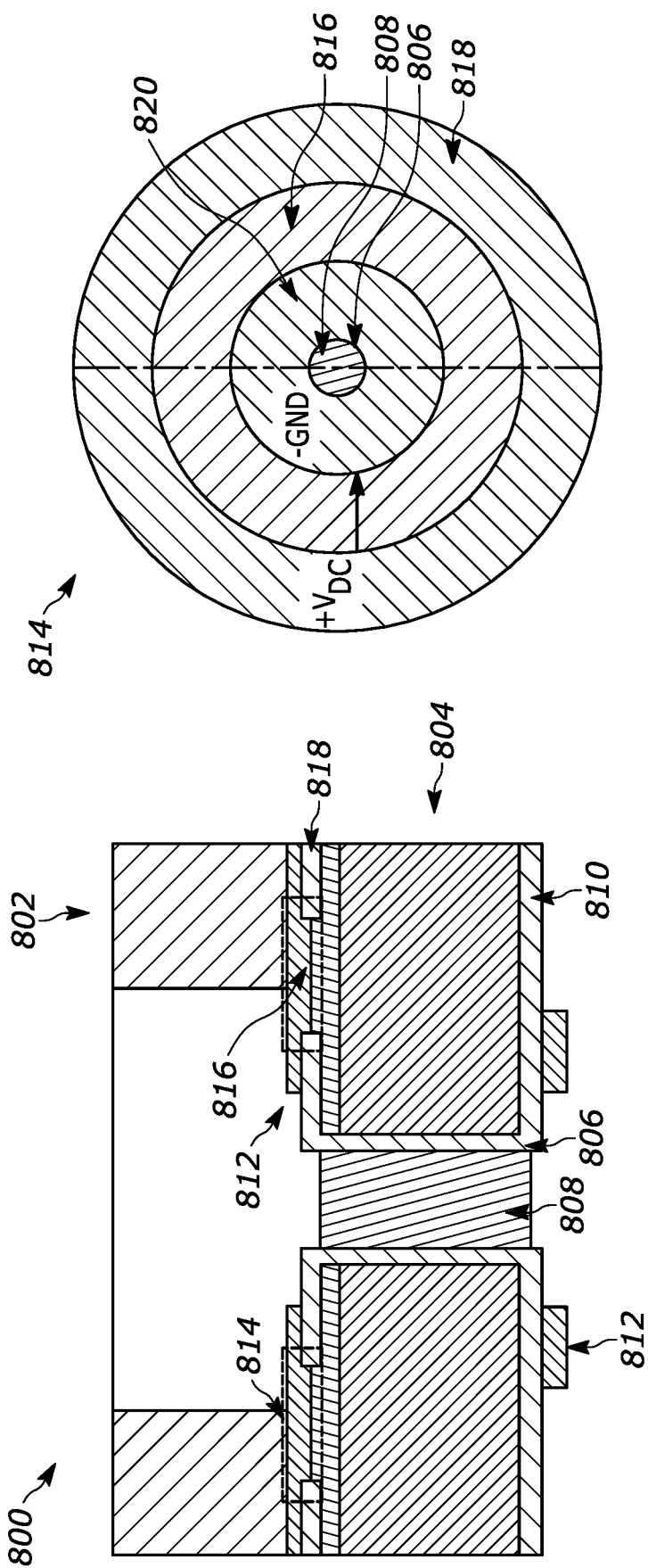
FIGS. 8A-B display a schematic diagram of a microphone assembly and resistor combination according to a fourth illustrative embodiment.

FIGS. 8A-B illustrate a microphone assembly and resistor combination according to a fourth embodiment and a particular use case. FIG. 8A is a cross-sectional view of a microphone assembly 800 including a MEMS transducer 802 mounted on a base 804 at least partially over a sound port 806 filled with water (or other liquid) 808 after the occurrence of a liquid ingress event. The water 808 prevents sound from properly penetrating the sound port 806 to access the acoustic transducer 802. The base 804 can be a printed circuit board or other surface-mountable electrical interface. The sound port 806 is a thermally and electrically conductive acoustic port, such as an electroplated via. The sound port 806 can be cylindrical in shape, and extends through the base 804 to a bottom face of the base. The bottom face of the base 804 has a solder ring ground 810 mounted thereon to which the conductive sound port 806 is electrically coupled. A solder resist ring 812 acts as an insulator on the bottom face of the base 804, and serves as an insulator between the electrically conductive sound port 806 and the MEMS transducer 802.

An annular resistive heating element (resistor) 814 is disposed around the sound port in a ring of electrically conductive material. The resistor 814 may fully or partially surround a circumference of the sound port 806. The resistor 814 can be comprised of concentric rings of resistive film 816, an outer copper pad 818 connected to an integrated circuit and an inner copper pad 820 connected to the sound port 806. Alternatively, the resistor 814 can be a continuous resistive film connecting the sound port 806 with the integrated circuit of FIG. 1. The integrated circuit can apply power to the resistor 814 to generate heat. Heat generated by the resistor can be conducted by the sound port 806 to heat the water 808 trapped therein. The applied heat increases the temperature of the water in the sound port to enhance the latent heat of evaporation of the liquid water and increase the pressure of the air inside the microphone assembly. The pressurized air acts to push the water out of the sound port 806, effectively clearing the microphone and restoring the assembly to full function.

Figure 9:
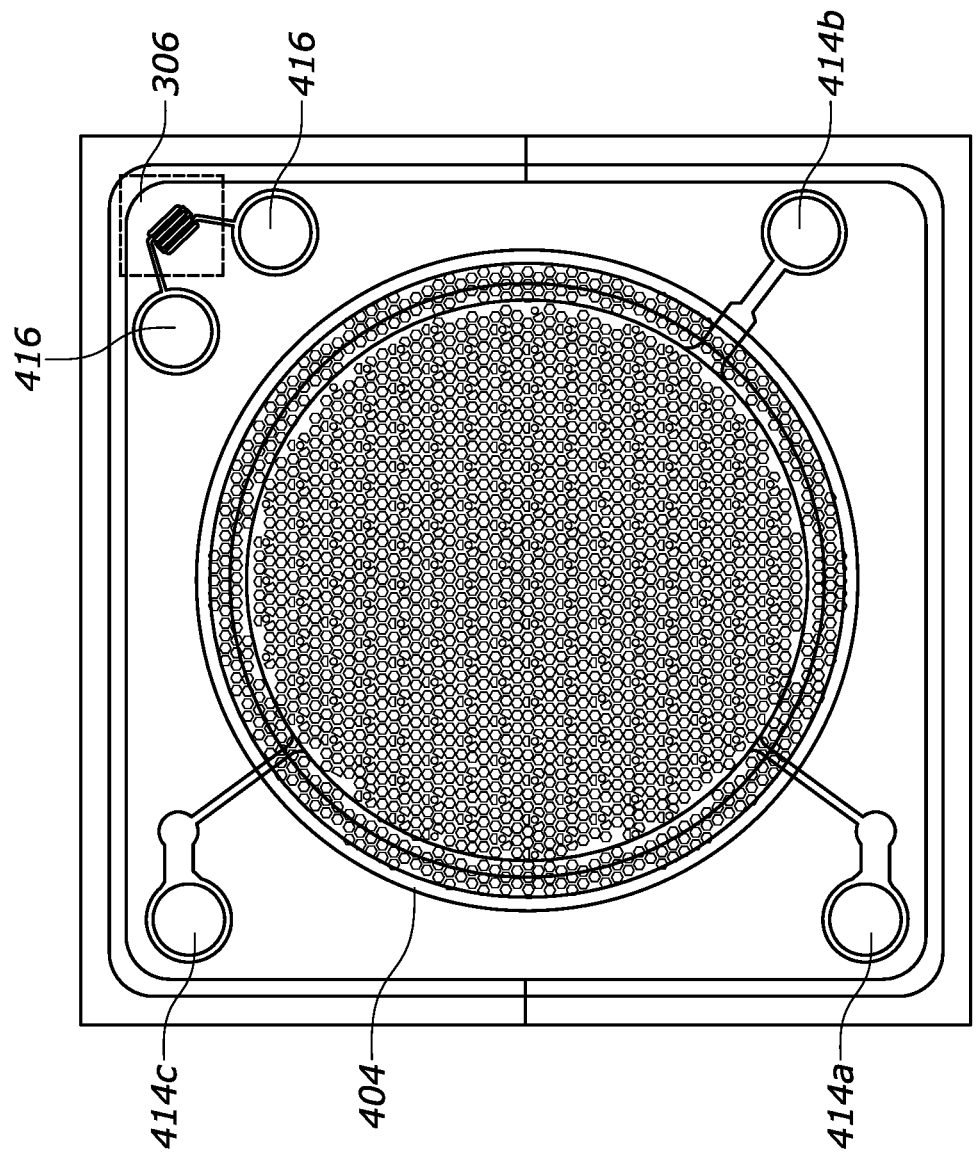
FIG. 9 is a schematic diagram of an exemplary MEMS transducer with a constrained diaphragm.

In some embodiments, the diaphragm in the acoustic transducer may also be utilized as a heating element with a similar function as annular resistive heating element 814. As shown in FIG. 9, by the use of a second electrical contact 414c to the diaphragm in the acoustic transducer, the integrated circuit can be configured to pass an electrical current thru the diaphragm between contacts 414a and 414c, resulting in resistive heating of the diaphragm. The elevated temperature of the diaphragm may help to evaporate any liquid trapped in the sound port in contact with the diaphragm.

In some embodiments, the annular resistor can also be used to keep the MEMS die attach soft during exposure to cold ambient temperatures. When the microphone assembly is exposed to extreme cold, the MEMS die attach can stiffen, and use of the microphone can contribute to package stress on the MEMS die. In some embodiments, a temperature sensor can be added within a back volume of the microphone assembly to sense the ambient temperature within the microphone package. The temperature sensor is coupled to the integrated circuit programmed to apply to power to the annular resistor. When the temperature within the microphone assembly drops below a predetermined threshold, for example, 0 degrees Celsius, the integrated circuit is programmed to apply power to the annular resistor to heat the MEMS die attach to which it is connected, as seen in FIG. 8A. The resistive heating of the MEMS die is to decrease the amount of stress on the MEMS attach and can mitigate changes in performance or prevent damage as a result of the stress. The integrated circuit may be programmed to supply current to the annular resistor on a microphone assembly level or on a system level. For example, the integrated circuit within the microphone assembly can be connected to temperature sensor and be programmed to control the annular resistor.

The aforementioned implementation requires more circuitry on the integrated circuit and additional space on the printed circuit board base to accommodate an extra electrical connection solder pad. In some implementations, rather than including a temperature sensor within the microphone package and using the integrated circuit to drive the resistor, the resistor control and/or driving circuitry may be implemented outside of the microphone package, such as within the host device. For example, a host device (such as a phone, tablet, recording device or the like) may include circuitry/functionality to control the annular resistor, such as with a native temperature sensor and integrated circuit. The integrated circuit is programmed to control the microphone assembly within the system, requiring reduced circuitry as the integrated circuit can utilize electrical contacts 416 of the resistor for heat control.

It will be appreciated that although the ideas herein are presented as individual embodiments, it is possible to combine elements of the embodiments described herein to obtain a combination of features not explicitly illustrated. For example, the annular resistor can be combined with any of the acoustic transducer assemblies described in FIGS. 2-6. Furthermore, the embodiments described herein are not limited to a single resistor, and may include a combination of the annular resistor of FIG. 8B in addition with any of the resistor embodiments disclosed in FIGS. 2-6 such that the embodiment contains two resistors for alternate purposes. In this case, the electrically isolated set of electrical contacts 416 for the resistor is present on the MEMS die and the outer copper pad 818 or electrode for the annular resistor is present in the printed circuit board base.

According to some embodiments, a microelectromechanical system (MEMS) transducer for integration in a microphone assembly having housing in which the transducer is disposed, comprises a substrate comprising an aperture; an electro-acoustic transduction element located at least partially over the aperture and coupled to the substrate; electrical contacts coupled to the transducer; and a resistor coupled to electrical contacts electrically isolated from the electrical contacts of the transducer.

In some embodiments, the transduction element can include an insulating material coupled to the substrate, the resistor is formed on the insulating material. The substrate can have a mounting surface and a surface opposite the mounting surface. The insulating material on which the resistor is formed is coupled to the surface of the substrate opposite the mounting surface. The resistor can be laterally offset relative to the aperture of the substrate. The transduction element can be a variable capacitor comprising a fixed electrode and a movable electrode located at least partially over the aperture of the substrate. At least one of the fixed electrode or the moving electrode can be formed on the insulating material. The movable electrode can be located between the substrate and the fixed electrode.

In some embodiments, the resistor is suspended from the insulating material. The substrate can have a mounting surface and a surface opposite the mounting surface. The insulating material from which the resistor is suspended can be coupled to the surface of the substrate opposite the mounting surface. The resistor can be laterally offset relative to the aperture of the substrate. The transduction element can be a variable capacitor comprising a fixed electrode and a movable electrode located at least partially over the aperture of the substrate. At least one of the fixed electrode or the moving electrode can be formed on the insulating material. The movable electrode can be located between the substrate and the fixed electrode. The transducer can be a variable capacitor comprising a fixed electrode and a movable electrode located at least partially over the aperture of the substrate, wherein at least one of the fixed electrode or the movable electrode is formed on the insulating material.

According to some embodiments, a microphone assembly comprises a housing having a sound port and a surface-mountable electrical interface; an acoustic transducer disposed within the housing, the transducer having electrical contacts; a resistor disposed in the housing, the resistor having electrical contacts electrically isolated from the electrical contacts of the transducer and an integrated circuit disposed in the housing and electrically coupled to the resistor, the transducer and to the electrical interface. The integrated circuit can be configured to apply power to the resistor and detect an acoustic signal generated by the transducer in response to detecting a change in pressure within the housing caused by heat produced by the resistor when the power is applied.

In some embodiments, the resistor can be integrated with the acoustic transducer. The acoustic transducer can be a microelectromechanical (MEMS) transducer comprising a substrate having an aperture acoustically coupled to the sound port, and the transducer is coupled to the substrate and can be located at least partially over the aperture. The transducer can be formed on an insulating material coupled to the substrate. The resistor can be formed on the insulating material. The substrate can include a mounting surface fastened to the housing and a surface opposite the mounting surface. The transducer and the insulating material on which the resistor is formed can be coupled to the surface of the substrate opposite the mounting surface. The resistor can be laterally offset relative to the aperture of the substrate. The transducer can be a variable capacitor comprising a fixed electrode and a movable electrode located at least partially over the aperture of the substrate, at least one of the fixed electrode or the moving electrode formed on the insulating material. The movable electrode can be located between the substrate and the fixed electrode.

In some embodiments, the microphone assembly comprises an annular resistor formed of a resistive film disposed around the sound port. The annular resistor includes an electrical contact pad coupled to the sound port. The electrical contact pad may be an extension of the sound port or an inner copper pad for connection to the sound port. The sound port can be thermally and electrically conductive. The annular resistor includes an electrode electrically coupled to the integrated circuit. The integrated circuit is configured to apply power to the electrode to generate resistive heat in the sound port; the heat is then thermally transferred through the entirety of the sound port. The annular resistor can be mounted on the surface-mountable electrical interface of the microphone assembly, or it can be embedded in the surface-mountable electrical interface. In some embodiments, the diaphragm in the acoustic transducer is utilized as a resistive heating element, where the diaphragm includes two separate electrical contacts connected to the integrated circuit. The integrated circuit is configured to apply power to the diaphragm to generate resistive heat on the diaphragm surface. In some embodiments, the resistor coupled to the transducer is the annular resistor. In some embodiments, the resistor coupled to the transducer is the diaphragm itself. In some embodiments, the microphone assembly comprises both the resistor coupled to the transducer and the annular resistor disposed to surround the sound port.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical system (MEMS) transducer for integration in a microphone assembly having housing in which the transducer is disposed, the transducer comprising:
   a substrate comprising an aperture;
   an electro-acoustic transduction element located at least partially over the aperture and coupled to the substrate;
   electrical contacts coupled to the transducer; and
   a resistor coupled to electrical contacts electrically isolated from the electrical contacts of the transducer,
   the transduction element is a variable capacitor comprising a fixed electrode and a movable electrode located at least partially over the aperture of the substrate and located on different layers from each other on a MEMS die, and
   the resistor located on a same layer on the MEMS die as the layer of one of the electrodes, and comprises a same material as the one of the electrodes.

2. The MEMS transducer of claim 1, the transduction element comprising an insulating material coupled to the substrate, the resistor formed on the insulating material.

3. The MEMS transducer of claim 1, the substrate having a mounting surface and a surface opposite the mounting surface, the insulating material on which the resistor is formed being coupled to the surface of the substrate opposite the mounting surface.

4. The MEMS transducer of claim 3, the resistor laterally offset relative to the aperture of the substrate.

5. The MEMS transducer of claim 1, the movable electrode located between the substrate and the fixed electrode.

6. The MEMS transducer of claim 1, the transduction element comprising an insulating material coupled to the substrate, the resistor suspended from the insulating material.

7. The MEMS transducer of claim 6, the substrate having a mounting surface and a surface opposite the mounting surface, the insulating material from which the resistor is suspended being coupled to the surface of the substrate opposite the mounting surface.

8. The MEMS transducer of claim 7, the resistor laterally offset relative to the aperture of the substrate.

9. The MEMS transducer of claim 1, the movable electrode located between the substrate and the fixed electrode.

10. A microphone assembly comprising:
    a housing including a sound port and a surface-mountable electrical interface;
    an acoustic transducer disposed within the housing, the transducer having electrical contacts;
    a resistor disposed in the housing, the resistor having electrical contacts electrically isolated from the electrical contacts of the transducer; and
    an integrated circuit disposed in the housing and electrically coupled to the resistor, the transducer, and to the electrical interface,
    wherein the integrated circuit is configured to:
      apply power to the resistor,
      detect ambient noise from an acoustic signal generated by the transducer, and
      drive a current through the resistor to produce a heat-induced acoustic signal to cancel the ambient noise.

11. The microphone assembly of claim 10, the resistor integrated with the acoustic transducer.

12. The microphone assembly of claim 11, wherein the acoustic transducer is a microelectromechanical (MEMS) transducer comprising a substrate having an aperture acoustically coupled to the sound port, the transducer coupled to the substrate and located at least partially over the aperture.

13. The microphone assembly of claim 12, the transducer formed on an insulating material coupled to the substrate, the resistor formed on the insulating material.

14. The microphone assembly of claim 13, the substrate having a mounting surface fastened to the housing and a surface opposite the mounting surface, the transducer and the insulating material on which the resistor is formed being coupled to the surface of the substrate opposite the mounting surface.

15. The microphone assembly of claim 14, the resistor laterally offset relative to the aperture of the substrate.

16. The microphone assembly of claim 15, the transducer is a variable capacitor comprising a fixed electrode and a movable electrode located at least partially over the aperture of the substrate, at least one of the fixed electrode or the moving electrode formed on the insulating material.

17. The microphone assembly of claim 16, the movable electrode located between the substrate and the fixed electrode.

18. The microphone assembly of claim 10, wherein the resistor is an annular resistor formed of a resistive film disposed around the sound port, the sound port electrically and thermally conductive and the electrical contacts coupled to the annular resistor and the integrated circuit,
    the integrated circuit is configured to apply power to at least one of the electrical contacts to generate resistive heat in the sound port.

19. The microphone assembly of claim 18, the annular resistor mounted on the surface-mountable electrical interface.

20. The microphone assembly of claim 18, the annular resistor embedded in the surface-mountable electrical interface.

21. A microphone assembly comprising:
    a housing having a thermally and electrically conductive sound port and a surface-mountable electrical interface;
    an acoustic transducer disposed within the housing, the transducer having electrical contacts; and
    an annular resistor formed of a resistive film disposed around the sound port, the annular resistor having at least one electrical contact structured to receive power from a device to drive the annular resistor to generate resistive heat in the sound port.

22. The microphone assembly of claim 21, wherein the device is an integrated circuit disposed inside the housing, the integrated circuit coupled to the electrical interface, the electrical contacts of the acoustic transducer, and the electrical contact of the annular resistor.

23. The microphone assembly of claim 21 or 22, the device configured to:
    receive a temperature measurement from a temperature sensor;
    determine that the temperature measurement is below a predetermined threshold; and
    apply power to the electrical contact of the annular resistor to generate resistive heat.

24. The microphone assembly of claim 22, wherein the acoustic transducer comprises:
    a substrate comprising an aperture;
    an electro-acoustic transduction element located at least partially over the aperture and coupled to the substrate; and
    a resistor coupled to electrical contacts electrically isolated from the electrical contacts of the transducer, wherein the electrical contacts of the transducer and the resistor are coupled to the integrated circuit, the integrated circuit configured to:
apply power to the resistor, and
detect an acoustic signal generated by the transducer in response to detecting a change in pressure within the housing caused by heat produced by the resistor when the power is applied.

25. A microphone assembly comprising:
a housing including a sound port and a surface-mountable electrical interface;
an acoustic transducer disposed within the housing, the transducer having electrical contacts;
at least two separate electrical contacts to a diaphragm within the acoustic transducer, thereby forming an electrical resistor within the diaphragm;
an integrated circuit disposed in the housing and electrically coupled to the resistor within the diaphragm, the transducer, and to the electrical interface,
wherein the integrated circuit is configured to:
apply power to the resistor within the diaphragm; and
detect an acoustic signal generated by the transducer in response to detecting a change in pressure across the diaphragm.

26. The microphone assembly according to claim 10, wherein the heat-induced acoustic signal is an audible heat-induced acoustic signal in a range of an audio frequency band detectable by a human ear.

27. A microphone assembly comprising:
a housing including a sound port and a surface-mountable electrical interface;
an acoustic transducer disposed within the housing, the transducer having electrical contacts;
a resistor disposed in the housing, the resistor having electrical contacts electrically isolated from the electrical contacts of the transducer; and
an integrated circuit disposed in the housing and electrically coupled to the resistor, the transducer, and the electrical interface,
wherein the integrated circuit is configured to drive a current through the resistor to produce an audible heat-induced acoustic signal.

28. The microphone assembly according to claim 27, wherein the audible heat-induced acoustic signal is in a range of an audio frequency band detectable by a human ear.

* * * * *